United States Patent
Heydari et al.

(10) Patent No.: US 7,289,326 B2
(45) Date of Patent: Oct. 30, 2007

(54) DIRECT CONTACT COOLING LIQUID EMBEDDED PACKAGE FOR A CENTRAL PROCESSOR UNIT

(75) Inventors: Ali Heydari, Albany, CA (US); Ji L. Yang, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/345,957

(22) Filed: Feb. 2, 2006

(65) Prior Publication Data

US 2007/0177352 A1  Aug. 2, 2007

(51) Int. Cl.
H05K 7/20 (2006.01)
H05K 5/00 (2006.01)
H01L 23/12 (2006.01)
H01L 23/34 (2006.01)

(52) U.S. Cl. ............ 361/699; 361/714; 361/719; 361/733; 257/704; 257/713; 257/714

(58) Field of Classification Search ................
165/104.11–104.12, 104.19, 80.4; 62/185, 62/259.2; 174/50.5; 361/697–699, 689, 361/688, 748, 719; 257/704, 710, 713
See application file for complete search history.

(56) References Cited

U.S. PATENT DOCUMENTS

| | | | |
|---|---|---|---|
| 5,021,924 A * | 6/1991 | Kieda et al. ............ | 361/699 |
| 5,365,402 A * | 11/1994 | Hatada et al. ........... | 361/699 |
| 5,436,793 A * | 7/1995 | Sanwo et al. ............ | 361/689 |
| 5,539,186 A * | 7/1996 | Abrami et al. ........... | 219/548 |
| 5,763,951 A * | 6/1998 | Hamilton et al. ......... | 257/714 |
| 5,870,823 A * | 2/1999 | Bezama et al. ............. | 29/848 |
| 6,292,365 B1 * | 9/2001 | Ashiwake et al. ........ | 361/700 |
| 6,637,231 B1 | 10/2003 | Monfarad | |
| 6,687,122 B2 | 2/2004 | Monfarad | |
| 6,717,812 B1 * | 4/2004 | Pinjala et al. ........... | 361/699 |
| 6,741,469 B1 | 5/2004 | Monfarad | |
| 6,785,134 B2 * | 8/2004 | Maveety et al. .......... | 361/699 |
| 6,796,370 B1 * | 9/2004 | Doll ....................... | 165/80.4 |
| 6,992,382 B2 * | 1/2006 | Chrysler et al. .......... | 257/717 |
| 7,007,506 B2 * | 3/2006 | Kubo et al. ............... | 62/515 |
| 7,042,723 B2 * | 5/2006 | Espersen et al. ......... | 361/699 |
| 7,064,953 B2 * | 6/2006 | Miller ..................... | 361/690 |
| 7,079,393 B2 * | 7/2006 | Colgan et al. ........... | 361/699 |
| 7,115,987 B2 * | 10/2006 | Holalkere et al. ........ | 257/713 |

(Continued)

*Primary Examiner*—Anatoly Vortman
*Assistant Examiner*—Bradley H Thomas
(74) *Attorney, Agent, or Firm*—William J. Kubida; Michael C. Martensen; Hogan & Hartson LLP

(57) ABSTRACT

A direct contact cooling liquid embedded package design for use with a computer central processor unit is suitable for thermal management of high heat dissipation electronic components such as server processors. The direct contact cooling liquid embedded packaged CPU has mechanical coupling and embedded plumbing that attaches to the board pumped liquid supply and direct contact cooling liquid of the heat-generating portion of the CPU. A direct contact cooling liquid embedded packaged CPU removes higher levels of heat directly from the core of the processors by convective cooling. Cooling liquid is introduced into the package of the server CPU by mechanically attaching the CPU to the board through a socket interconnect. Pins of the socket serve to provide electrical connection between the board and the CPU, while a few pins are designed for the purpose of inlet and outletting cooling liquid into and out of the CPU package.

20 Claims, 2 Drawing Sheets

U.S. PATENT DOCUMENTS

| | | | |
|---|---|---|---|
| 7,120,021 B2 * | 10/2006 | Hamman | 361/699 |
| 2004/0190252 A1 * | 9/2004 | Prasher et al. | 361/699 |
| 2004/0262743 A1 * | 12/2004 | Houle et al. | 257/712 |
| 2005/0068725 A1 * | 3/2005 | Houle et al. | 361/688 |
| 2005/0205241 A1 * | 9/2005 | Goodson et al. | 165/80.4 |
| 2006/0034052 A1 * | 2/2006 | Chang et al. | 361/697 |
| 2006/0108097 A1 * | 5/2006 | Hodes et al. | 165/80.4 |
| 2006/0120048 A1 * | 6/2006 | Houle et al. | 361/699 |
| 2007/0076374 A1 * | 4/2007 | Mongia et al. | 361/699 |

* cited by examiner

DIRECT CONTACT COOLING LIQUID EMBEDDED PACKAGE FOR A CENTRAL PROCESSOR UNIT

BACKGROUND OF THE INVENTION

Removal of heat has become one of the most important and challenging issues facing computer system designers today. As the rate of power dissipation from electronic components such as high performance server processors and other such integrated circuits continues to increase, standard conduction and forced-air convection fan air cooling techniques no longer provide adequate cooling for such sophisticated electronic components. The reliability of the electronic system will suffer if high temperatures at hot spot locations are permitted to persist.

Conventional thermal control schemes such as air-cooling with fans, thermoelectric cooling, heat pipes, and passive vapor chambers have either reached their practical application limit or are soon to become impractical for high power electronic components such as computer server processors. When standard cooling methods are no longer adequate, computer manufacturers are forced to reduce the speed of their processors to match the capacity of existing cooling apparatuses, accept lower component reliability due to inadequate cooling using existing cooling apparatus, or delay release of products until a reliable cooling apparatuses for removal of heat from high heat dissipating processors are made available. Additionally, thermal management of high heat flux CPUs and other integrated circuits may require the use of bulky heat fans and heat sink assembly units, which have limited the ability of computer server manufacturers to adequately increase the capacity of their systems due to space limitations.

The computer industry is seriously considering utilizing active liquid cooling as an alternative to conventional passive air cooling for use in conjunction with high performance and high power processors. A number of attempts to incorporate liquid for cooling of high powered processors in the form of submerged liquid, liquid spray cooling, refrigeration cooling, and the like have been tried in the past, but none of the existing active liquid cooling solutions have been successfully utilized outside of their specific design conditions.

What is desired, therefore, is a practical and efficient packaging technique for cooling CPUs and other high heat-producing integrated circuits that overcomes the deficiencies of the prior art cooling techniques as set forth above.

SUMMARY OF THE INVENTION

According to the present invention, a direct contact cooling liquid embedded package design for use with a computer central processor unit is suitable for thermal management of high heat dissipation electronic components such as server processors, but can be used with other high heat-producing integrated circuits. According to an embodiment of the present invention, the direct contact cooling liquid embedded packaged CPU has proper mechanical coupling and embedded plumbing that attaches to the board pumped liquid supply and direct contact cooling liquid of the heat-generating portion of the CPU. As a result, a direct contact cooling liquid embedded packaged CPU is utilized to remove substantially higher levels of heat directly from the core of the processors by convective cooling or in some extremes by pool boiling of the cooling liquid coming into direct contact with core of the CPU. Cooling liquid is introduced into the package of the server CPU by mechanically attaching the CPU to the board through a socket interconnect. Pins of the socket serves to provide electrical connection between the board and the CPU, while a few pins are designed for the purpose of inletting and outletting cooling liquid into and out of the CPU package.

According to an embodiment of the present invention, a PGA (pin grid array) flip-chip server CPU is attached to the cooling liquid in the system through mechanical connection of a specially designed socket unit. In addition to providing substantial heat removal ability, the packaging system of the present invention eliminates the need for a fan and heat sink air cooling system. The space traditionally occupied by these cooling components is therefore beneficially reduced. A much denser design of server boards with a larger number of components per board and a higher number of server processors can be achieved beyond that which is currently available. Other packaging systems than the flip-chip system can be used with the present invention such as a PGA socket, µPGA socket, PPGA socket, LGA socket or the like.

According to an embodiment of the present invention, aggressive thermal management of a high heat flux server processor is achieved using direct contact liquid cooling of the heat generating part of a processor by passing cooling liquids through the hermetically sealed package of the processor. Utilizing a specially-designed socket, cooling liquid is introduced through the specific pin locations of the socket into the processor package. Mechanical loading of the processor over the socket provides both electrical contacts to signal paths and liquid channels opening to the inlet/outlet liquid channels on the board.

Microchannels built into the substrate and cavity portion of the package provides the pathway for an inlet and an outlet of the cooling liquid into the silicon processor portion of the package. Flow of the cooling liquid over the silicon die takes away heat generation in the die and heated liquid is forced out of the package cavity due to the pressure gradient of the liquid cooling system. The cooling liquid can be a dielectric liquid that is thermally conductive but electrically resistive, to not cause any electrical shortage when it comes in contact with the silicon die or any other electrical portion of the package. The liquid flow rate and choice of cooling liquid is selected to prevent any massive boiling of the cooling liquid over the silicon die. Additionally, the cooling system pressure difference can be designed to make the entire cooling system orientation-independent for cooling purposes. A self-locking mechanism can be used to prevent introduction of any foreign material or particles into the package, and any spillage of the cooling liquid in case of a rework process.

According to an embodiment of the present invention, the direct contact cooling liquid embedded package for a CPU is an improved liquid-based cooling system that takes a cooling liquid to the heart of the heat generating component of the central processor unit. It can radically improve heat transfer for high heat flux processors by providing direct contact between the heat generating silicon die and the cooling liquid. The direct contact liquid cooling package system of the present invention substantially removes any issues such as hot spots, thermal mismatch, high mechanical loading, or the like that should ideally be managed for traditional air cooling or indirect liquid cooling of the processors. Additionally, the cooling system of the present invention substantially removes the need for a fan/heat sink assembly and therefore frees a great deal of space over the board and in the server. The cooling system of the present invention is either unique to the server or may be tied into the data-center central cooling system.

The cooling system of the present invention also uses the existing package-to-board practice of using sockets and therefore the entire cooling system is embedded into the processor-to-board assembly. From the end user's point of view, there is a tremendous amount of simplification of board design as the bulky fan and heat sink assemblies are removed. The replacement, according to the present invention, is a central liquid cooling system that can be made redundant to substantially prevent any reliability issues in the field.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION

Figure 1:
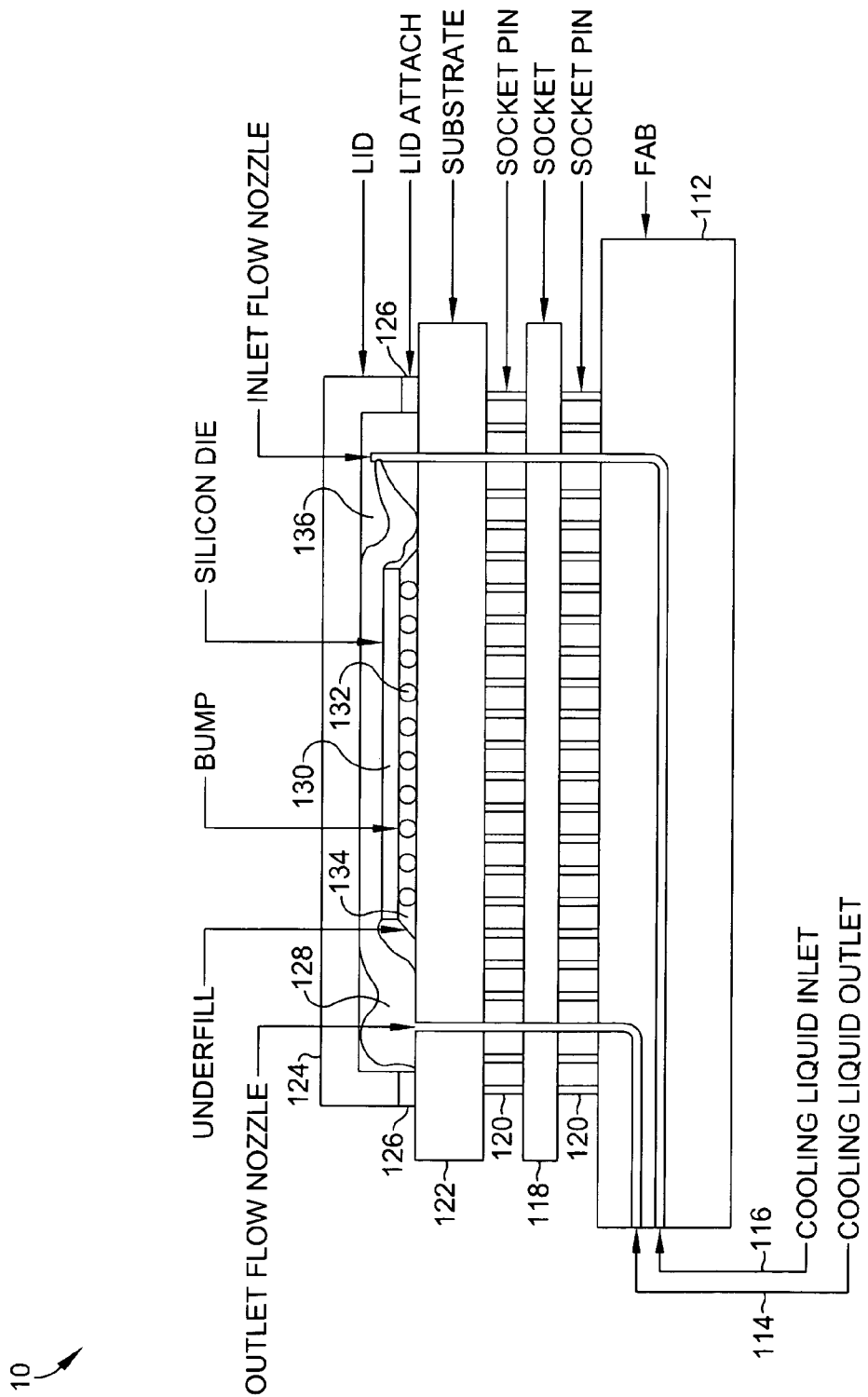
FIG. 1 is an expanded cross-sectional diagram of the direct contact cooling packaging system of an embodiment of the present invention.

Referring now to FIG. 1, a package assembly 10 for an integrated circuit employing direct contact liquid cooling includes a board or "fab" 112 having a liquid coolant inlet 116 and a liquid coolant outlet 114, a socket 118 coupled to the board 112, and a package substrate 122 coupled to the socket 118. In the expanded cross-sectional view of FIG. 1, the board 112, the socket 118, and package substrate 122 are coupled together through socket pins 120. In actual usage, the board 112, the socket 118, and the package substrate 122 are in closer physical contact than is shown in FIG. 1. The expanded cross-sectional view of FIG. 1 is provided for ease of understanding the relationship of the individual components of the present invention only. A first microchannel allows liquid coolant 128 to flow from the liquid coolant inlet 116 through the board 112, the socket 118, and the package substrate 122. A second microchannel allows liquid coolant 128 to flow through the package substrate 122, the socket 118, and the board 112 to the liquid coolant outlet 114. An integrated circuit or silicon die 130 such as a CPU or other high heat-producing integrated circuit is attached to the top surface of the package substrate 122. A lid 124 is provided for surrounding the integrated circuit 130. A lid attachment 126 is provided for hermetically sealing the lid 124 to the substrate 122 to allow the liquid coolant 128 to flow freely across a top surface of the integrated circuit 130.

In the package system of FIG. 1, the substrate 122 is preferably a ceramic molding material including one or more layers of metal interconnect circuits providing electrical connection between top and bottom metallic connection pads. The lateral dimensions of the substrate 122 are about 50×50 mm$^2$, and the substrate 122 is about 2 mm thick. Of course, these dimensions can be changed as is required to accommodate a specific application using a larger or smaller integrated circuit 130. Microchannels 114 and 116 have a diameter of about 0.5 mm. The diameter can be changed slightly, but should ideally conform to the constraints imposed by the dimensions of the socket pins 120 as shown in FIG. 1.

As previously stated, the integrated circuit 130 is typically a CPU or microprocessor, but any other high heat-producing integrated circuit 130 can be accommodated, such as a sophisticated digital signal processing integrated circuit, mixed analog/digital integrated circuit, or even a power or driver type of integrated circuit.

The package system 10 shown in FIG. 1 includes a number of electrically conductive bumps 132 for attaching the integrated circuit 130 to the top surface of the package substrate 122. An underfill material 134 is used for conformally coating the electrically conductive bumps. Non-conductive underfill materials suitable for this purpose are known to those skilled in the art.

The package system 10 shown in FIG. 1 includes a self-locking attachment mechanism 126 for assuring a hermetic seal.

The liquid coolant 128 is ideally a fluorocarbon liquid coolant, which is thermally conductive, but electrically insulative. Cooling liquids should ideally be electrically compatible with the silicon die 130, as there is direct physical contact in the case of the present invention. The recommended coolant fluid 128 is a fluorocarbon coolant fluid such as FC-72, FC-77, FC-86.

The board or "fab" 112 can service one or more CPUs 130. The cooling liquid inlet/outlet 116/114 to the fab 112 can have a variety of forms, ranging from a liquid inlet from a local (to a computer server box) liquid distribution device to that coming from the data center chiller. Similarly, the cooling liquid outlet 114 can go to a local heat exchanger (for removal of heat collected by the cooling liquid 128 to an area in the data center close to the server box) to the cooling tower of the data center, for removal of collected heat to the ambient. The board 112 shown in FIG. 1 is a conduit for carrying cooling liquid 128 in and out of direct contact with the CPU 130 for cooling purposes.

It is important to note, that while the flip-chip style of packaging according to an embodiment of the present invention is shown in FIG. 1, it is contemplated that the present invention can be easily applied to other known methods of packaging.

It is also important to note that the cooling liquid inlet/outlet 116/114 to the cavity 136 of the package system 10 are through tubes that are coupled to the substrate 112 of the package. The substrate 112 has internal liquid channels that lets the cooling liquid 128 flow in/out of the package. Therefore, there is no need for any extra assembly, such as tubes for letting in/out the cooling liquid 128 into the package.

Figure 2:
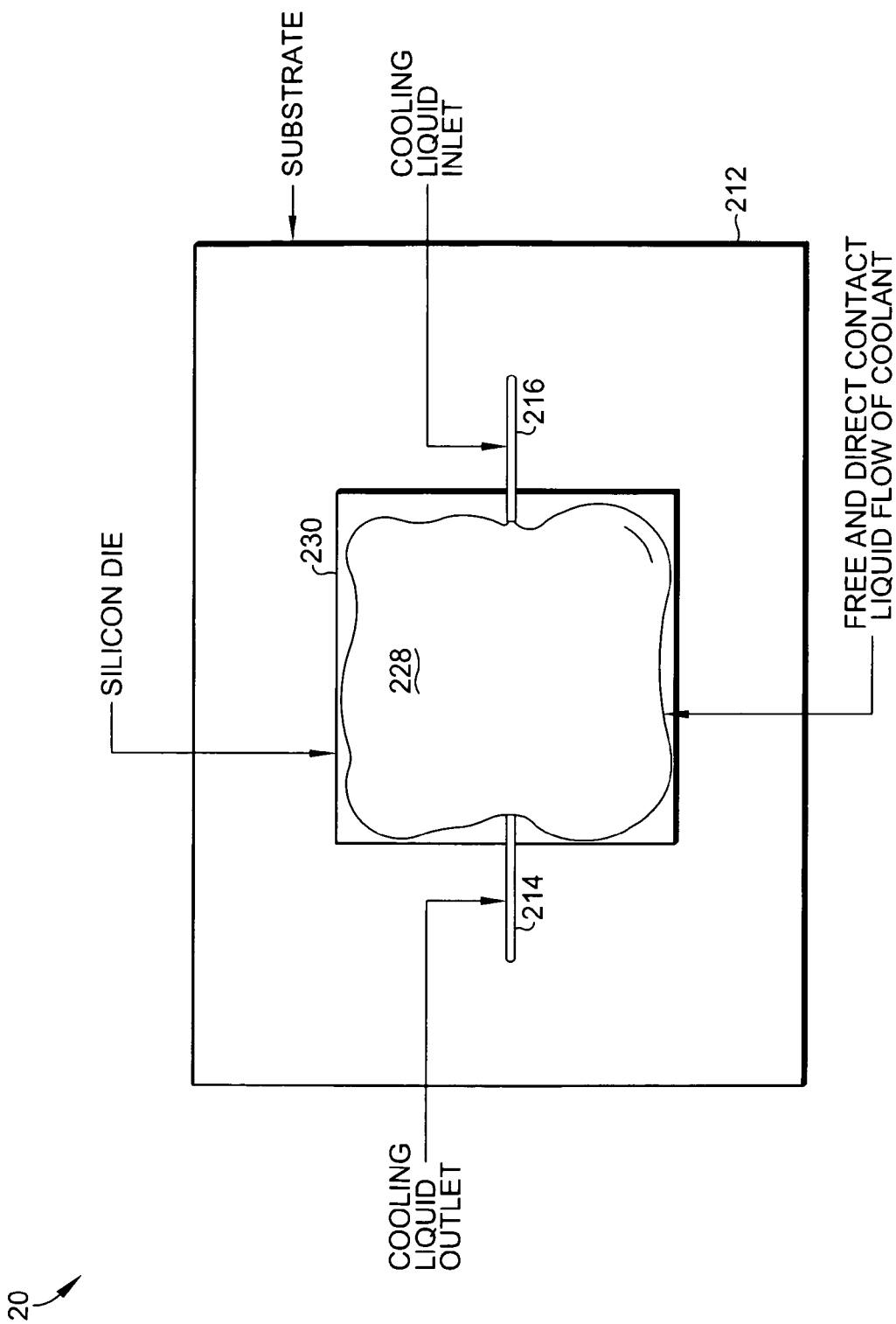
FIG. 2 is a plan view of the direct contact cooling packaging system shown in FIG. 1.

Referring now to FIG. 2, a plan view of the direct contact cooling package system 20 of the present invention is shown in a plan view, with the top lid of the packing system 20 removed to show the silicon die 230 and the liquid coolant flow 228. Also shown in FIG. 2 is the package substrate 212, the cooling liquid inlet 216, and the cooling liquid outlet 214.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A package for an integrated circuit employing direct contact liquid cooling comprising:
   a board, wherein the board includes a liquid coolant inlet and a liquid coolant outlet;
   a socket coupled to the board;
   a substrate coupled to the socket via a plurality of socket pins wherein a first socket pin includes a first microchannel, the first microchannel providing a means for allowing liquid coolant to flow from the liquid coolant inlet through the board, the socket and a bottom surface of the substrate to a top surface of the substrate and wherein a second socket pin includes a second microchannel, the second microchannel providing a means for allowing liquid coolant to flow from the top surface of the substrate to the bottom surface of the substrate and through the socket and the board to the liquid coolant outlet;
   an integrated circuit attached to the top surface of the substrate;
   a lid for surrounding the integrated circuit; and
   a lid attachment providing a means for hermetically sealing the lid to the substrate to allow the liquid coolant to flow freely across a top surface of the integrated circuit.

2. The package of claim 1 wherein the substrate comprises ceramic molding material including at least one layer of metal interconnect circuits providing electrical connection between top and bottom metallic connection pads.

3. The package of claim 1 wherein the lateral dimensions of the substrate are about 50×50 mm$^2$.

4. The package of claim 1 wherein the substrate is about 2 mm thick.

5. The package of claim 1 wherein each microchannel has a diameter of about 0.5 mm.

6. The package of claim 1 wherein the integrated circuit comprises a microprocessor.

7. The package of claim 1 further comprising a plurality of electrically conductive bumps providing a means for attaching the integrated circuit to the top surface of the substrate.

8. The package of claim 7 further comprising an underfill material providing a means for conformally coating the plurality of electrically conductive bumps.

9. The package of claim 1 wherein the lid attachment comprises a self-locking attachment mechanism.

10. The package of claim 1 wherein the liquid coolant comprises a fluorocarbon liquid coolant.

11. A package assembly for an integrated circuit employing direct contact liquid cooling comprising:
    a board having a liquid coolant inlet and a liquid coolant outlet;
    a socket coupled to the board;
    a package substrate coupled to the socket via a plurality of socket pins;
    a first microchannel providing a means for allowing liquid coolant to flow from the liquid coolant in let through the board, the socket, a first socket pin, and the package substrate;
    a second microchannel providing a means for allowing liquid coolant to flow through the package substrate, a second socket pin, the socket, and the board to the liquid coolant outlet;
    an integrated circuit attached to the top surface of the package substrate;
    a lid for surrounding the integrated circuit; and
    a lid attachment providing a means for hermetically sealing the lid to the package substrate to allow the liquid coolant to flow freely across a top surface of the integrated circuit.

12. The package of claim 11 wherein the package substrate comprises ceramic molding material including at least one layer of metal interconnect circuits providing electrical connection between top and bottom metallic connection pads.

13. The package of claim 11 wherein the lateral dimensions of the package substrate are about 50×50 mm$^2$.

14. The package of claim 11 wherein the package substrate is about 2 mm thick.

15. The package of claim 11 wherein each microchannel has a diameter of about 0.5 mm.

16. The package of claim 11 wherein the integrated circuit comprises a microprocessor.

17. The package of claim 11 further comprising a plurality of electrically conductive bumps for attaching the integrated circuit to the top surface of the package substrate.

18. The package of claim 17 further comprising an underfill material for conformally coating the plurality of electrically conductive bumps.

19. The package of claim 11 wherein the lid attachment comprises a self-locking attachment mechanism.

20. The package of claim 11 wherein the liquid coolant comprises a fluorocarbon liquid coolant.

* * * * *